(12) United States Patent
Mueller et al.

(10) Patent No.: US 9,653,880 B2
(45) Date of Patent: May 16, 2017

(54) TUNABLE, NARROW LINEWIDTH SINGLE TRANSVERSAL MODE LIGHT SOURCE USING A QUASI-INCOHERENT BROADBAND PUMP SOURCE

(71) Applicant: QIOPTIQ PHOTONICS GMBH & CO. KG, Goettingen (DE)

(72) Inventors: Frank Mueller, Munich (DE); Arne Härter, München (DE)

(73) Assignee: QIOPTIQ PHOTONICS GMBH & CO. KG, Göttingen (DE)

( * ) Notice: Subject to any disclaimer, the term of this patent is extended or adjusted under 35 U.S.C. 154(b) by 0 days.

(21) Appl. No.: 15/158,985

(22) Filed: May 19, 2016

(65) Prior Publication Data
US 2016/0344155 A1  Nov. 24, 2016

(30) Foreign Application Priority Data

May 19, 2015  (EP) .................................... 15168209
May 19, 2015  (EP) .................................... 15168216

(51) Int. Cl.
*H01S 5/00*  (2006.01)
*H01S 3/0933*  (2006.01)
(Continued)

(52) U.S. Cl.
CPC ............. *H01S 5/0092* (2013.01); *G02F 1/39* (2013.01); *H01S 3/0092* (2013.01);
(Continued)

(58) Field of Classification Search
CPC .... H01S 3/1083; H01S 3/0915; H01S 3/0933; H01S 3/1022; H01S 3/1028; H01S 3/1026; H01S 3/0092
See application file for complete search history.

(56) References Cited

U.S. PATENT DOCUMENTS 5,144,630 A * 9/1992 Lin .................... G02F 1/3532
                                              359/330
5,296,960 A    3/1994 Ellingson et al.
(Continued)

FOREIGN PATENT DOCUMENTS

EP          1006967 A1    6/2000

OTHER PUBLICATIONS

K-J Boller, et al.; "Diode-pumped optical parametric oscillators"; Quantum and Semiclassical Optics: Journal of the European Optical Society Part B, Institute of Physics, Bristol, GB, vol. 9, No. 2, Apr. 1, 1997.

(Continued)

*Primary Examiner* — Kinam Park
(74) *Attorney, Agent, or Firm* — Peter A. Nieves; Sheehan Phinney Bass & Green PA

(57) ABSTRACT

A light source is disclosed, having a quasi-incoherent broadband pump source configured to produce a longitudinally and transversally multi-mode pump beam. The light source may include a means for narrowing the linewidth of the pump beam. The light source includes an optical parametric oscillator with an optical cavity containing a crystal. The optical parametric oscillator is configured to receive light from the pump source and produce a first output light beam and a second output light beam. An optical coupler is disposed between the pump source and the optical parametric oscillator. At least one of the first and second output light beams is a substantially single transversal mode light having a narrower linewidth than the pump source.

20 Claims, 4 Drawing Sheets

(51) Int. Cl.
  *H01S 3/102* (2006.01)
  *H01S 3/0915* (2006.01)
  *H01S 3/108* (2006.01)
  *H01S 3/00* (2006.01)
  *G02F 1/39* (2006.01)
  *H01S 5/40* (2006.01)

(52) U.S. Cl.
  CPC .......... *H01S 3/0915* (2013.01); *H01S 3/0933* (2013.01); *H01S 3/1022* (2013.01); *H01S 3/1026* (2013.01); *H01S 3/1028* (2013.01); *H01S 3/1083* (2013.01); *H01S 5/4025* (2013.01)

(56) References Cited

U.S. PATENT DOCUMENTS 5,912,910 A * 6/1999 Sanders ................ G02F 1/3534
  359/326
2006/0239604 A1 * 10/2006 Marhic ................... G02F 1/395
  385/13
2007/0035810 A1 * 2/2007 Henderson ............ H01S 3/0675
  359/330
2014/0023098 A1 * 1/2014 Clarkson ............... H01S 3/0675
  372/3

OTHER PUBLICATIONS

Yu E. D'Yakov, et al.; "Theory of a multimode-pumped optical parametric oscillator emitting a narrow line," Soviet Journal of Quantum Electronics, vol. 5, No. 10, Oct. 31, 1975.

Yabai He, et al.; "Tunable Single-Mode Operation of a Pulsed Optical Parametric Oscillator Pumped by a Multimode Laser", Applied Optics, vol. 40, No. 27, Sep. 1, 2001.

European Search Report for EP patent application 15168209.3, dated Dec. 1, 2015.

European Search Report for EP patent application 15168216.8, dated Dec. 1, 2015.

Devi, Kavita et al.; "Tunable Continuous-Wave, Ultraviolet Source Based on Intracavity Sum-Frequency-Generation in an Optical Parametric Oscillator Using BiB3O6", Optics Express, vol. 21, No. 21, Oct. 21, 2013.

* cited by examiner

TUNABLE, NARROW LINEWIDTH SINGLE TRANSVERSAL MODE LIGHT SOURCE USING A QUASI-INCOHERENT BROADBAND PUMP SOURCE

CROSS-REFERENCE TO RELATED APPLICATIONS

This application claims priority to European Patent Application serial number 15168209.3, filed May 19, 2015, entitled "Tunable, Narrow Linewidth Single Transversal Mode Light Source Using a Quasi-Incoherent Broadband Pump Source," and to European Patent Application serial number 15168216.8, filed May 19, 2015, entitled "Quasi-Incoherent Broadband Pumped, Tunable, Narrow Linewidth Light Source," both of which are incorporated by reference herein in their entirety.

FIELD OF THE INVENTION

The present invention relates to light sources, and more particularly, is related to devices utilizing resonators with imbedded nonlinear optics.

BACKGROUND OF THE INVENTION

An optical parametric oscillator (OPO) is a light source emitting radiation with properties comparable to that of a laser. OPOs are nonlinear devices that split short wavelength pump photons into two longer wavelength photons, namely signal and idler photons. The wavelengths of the signal and idler photons are not independent from each other, but may be tuned in wavelength.

As shown by FIG. 1, an OPO converts an input laser wave (the "pump") with frequency $\omega_p$ into two output waves of lower frequency ($\omega_s$, $\omega_i$) via second-order nonlinear optical interaction. The sum of the frequencies of the output waves is equal to the input wave frequency: $\omega_s + \omega_i = \omega_p$. For historic reasons, the output wave with the higher frequency $\omega_s$ is called the signal, and the output wave with the lower frequency $\omega_i$ is called the idler. Because the OPO does not convert all the input energy into the signal and idler, a residual pump wave is also output.

OPOs need an optical resonator, but in contrast to lasers, OPOs are based on direct frequency conversion in a nonlinear crystal rather than from stimulated emission. OPOs exhibit a power threshold for an input light source (pump), below which there is negligible output power in the signal and idler bands.

OPOs include an optical resonator (cavity) and a nonlinear optical crystal. The optical cavity is an arrangement of mirrors that forms a resonator for light waves. Light confined in the cavity is reflected multiple times resulting in a multi-pass through the nonlinear crystal. The optical cavity serves to resonate at least one of the signal and idler waves. In the nonlinear optical crystal, the pump, signal and idler beams overlap.

While conventional lasers produce limited fixed wavelengths, OPOs may be desirable because the signal and idler wavelengths, which are determined by the conservation of energy and momentum (via phase matching), can be varied in wide ranges. Thus it is possible to access wavelengths, for example in the mid-infrared, far-infrared or terahertz spectral region, which may be difficult to obtain from a laser. In addition, OPOs allow for wide wavelength tunability, for example, by changing the phase-matching condition. This makes OPOs a useful tool, for example, for laser spectroscopy.

A limitation is that OPOs generally require a pump source with high optical intensity and relatively high spatial coherence. An OPO is usually pumped by a laser, but the direct use of a laser diode is usually not easily possible. Therefore, the system becomes relatively complex, for example consisting of a diode-pumped solid-state laser or laser devices utilizing fiber-amplification, and the actual OPO. However, such pumps producing high quality beams may be expensive, large, and produce considerable heat. For example, OPOs are typically pumped using coherent narrow linewidth lasers, for example, at 1064 nm. Therefore, there is a need in the industry to address one or more of the above mentioned shortcomings.

SUMMARY OF THE INVENTION

Embodiments of the present invention provide a tunable, narrow linewidth single transversal mode light source using a quasi-incoherent broadband pump source. Briefly described, the present invention is directed to a light source having a quasi-incoherent broadband pump source configured to produce a longitudinally and transversally multi-mode pump beam. An Optical Parametric Oscillator (OPO) having an optical cavity contains a crystal configured to receive light from the pump source and produce a first output light beam and a second output light beam. An optical coupler is between the pump source and the OPO. At least one of the first and second output light beam includes substantially single transversal mode light having a narrower linewidth than the pump source.

Other systems, methods and features of the present invention will be or become apparent to one having ordinary skill in the art upon examining the following drawings and detailed description. It is intended that all such additional systems, methods, and features be included in this description, be within the scope of the present invention and protected by the accompanying claims.

BRIEF DESCRIPTION OF THE DRAWINGS

The accompanying drawings are included to provide a further understanding of the invention, and are incorporated in and constitute a part of this specification. The components in the drawings are not necessarily to scale, emphasis instead being placed upon clearly illustrating the principles of the present invention. The drawings illustrate embodiments of the invention and, together with the description, serve to explain the principals of the invention.

DETAILED DESCRIPTION

Figure 1:
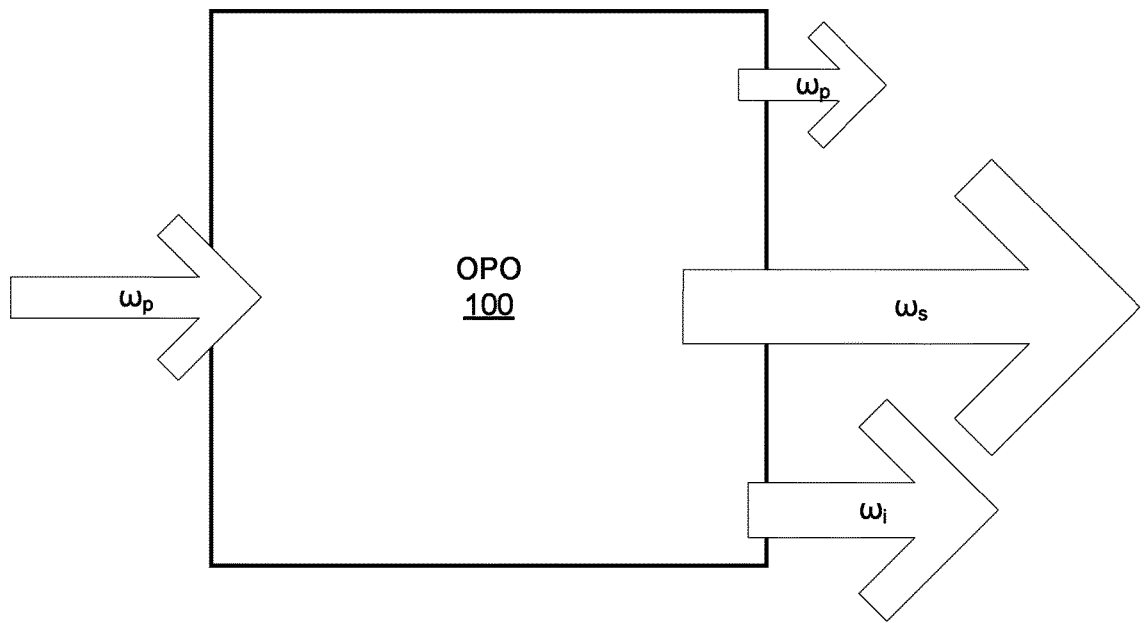
FIG. 1 is a general schematic diagram of an OPO.

The following definitions are useful for interpreting terms applied to features of the embodiments disclosed herein, and are meant only to define elements within the disclosure. No limitations on terms used within the claims are intended, or should be derived, thereby. Terms used within the appended claims should only be limited by their customary meaning within the applicable arts.

As used within this disclosure, "narrow linewidth" is determined relative to the context of the beam being discussed. For the pump, narrow linewidth generally refers to a linewidth of less than 10 GHz. With regard to the resonated wave, "narrow linewidth" may be on the order of less than GHz range, or even MHz, much narrower than the pump. Radiation that does not meet these requirements of a "narrow linewidth" is referred to herein as "broadband."

As used within this disclosure, "linewidth-narrowing" refers to the narrowing of the linewidth of a broadband source to values above 10 GHz. Such a "linewidth-narrowed" beam is thus still termed "broadband" following the above definition.

As used within this disclosure, OPO generally refers to a continuous wave OPO (cw-OPO), rather than a pulsed OPO. In general, "continuous wave" or "CW" refers to a laser that produces a continuous output beam, sometimes referred to as "free-running," as opposed to a q-switched, gain-switched or mode locked laser, which has a pulsed output beam.

As used within this disclosure, "beam quality" generally refers a quantitative measure of the quality of a laser beam and according to ISO standard 11146. $M^2$ is a dimensionless beam propagation parameter used to quantify and determine the beam propagation characteristics.

As used within this disclosure, "quasi-incoherent" means a transversally multi-mode light source with an $M^2$ value much larger than unity. For example an $M^2$ squared value of three may be considered as quasi-incoherent, but a preferred quasi-incoherent source would have a $M^2$ value of eight or larger. Such a light source may also be referred to as having an $M^2$ value much larger than unity.

As used within this disclosure, "substantially single transversal mode light" means a light source having a dominant contribution of a single transversal mode, preferably $TEM_{00}$, for example with $M^2$ less than three. Other types of substantially single transversal mode light may be used, for example, $TEM_{01}$.

As used within this disclosure, "substantially" means very nearly, or to within manufacturing tolerances acceptable to a person having ordinary skill in the art. For example, substantially single transversal mode light refers to light produced by an OPO as would close to single transversal mode light as may be expected to be produced by an OPO.

As used within this disclosure, "mirror" refers to an optical element having at least one reflective surface. The reflective surface may reflect light received from one direction, but transmit light received from other directions. The reflective surface may reflect some wavelengths and transmit other wavelengths. Further the reflective surface may partially transmit and partially reflect some wavelengths.

Reference will now be made in detail to embodiments of the present invention, examples of which are illustrated in the accompanying drawings. Wherever possible, the same reference numbers are used in the drawings and the description to refer to the same or like parts.

In general, embodiments of the present invention include devices and methods for producing coherent, narrow linewidth cw-laser radiation from an OPO using a quasi-incoherent, broadband laser. The quasi-incoherent broadband pump source may be frequency stabilized.

Figure 2:
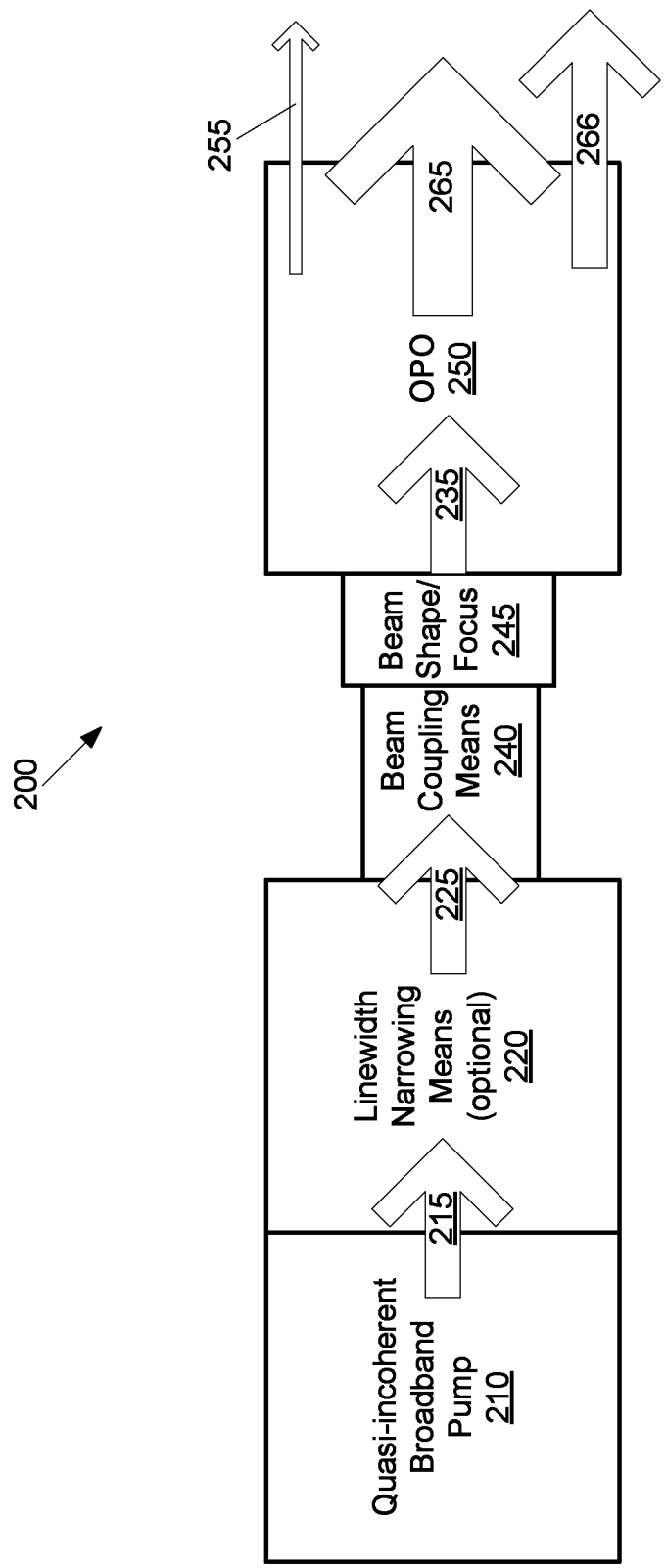
FIG. 2 is a schematic diagram of an exemplary first embodiment of an OPO pumped by a quasi-incoherent broadband source.

A first exemplary embodiment 200 of an OPO pumped by a quasi-incoherent, broadband pump laser is shown in FIG. 2. A quasi-incoherent, broadband pump laser 210 is coupled with a frequency stabilizing linewidth-narrowing means 220. In alternative embodiments, the coupled broadband pump laser 210 and frequency stabilizing linewidth-narrowing means 220 may be replaced by an integrated source. For example, certain diode laser sources have an integrated frequency-narrowing means or may be spectrally narrow due to their general structure. The linewidth-narrowing means 220 receives a raw pump beam 215 from the pump laser 210, and produces a frequency stabilized linewidth-narrowed pump beam 225. The narrowed pump beam 225 is received by a beam coupler 240, for example, a multi-mode optical fiber, or other suitable wave guide. A beam shaper/focuser 245 receives the narrowed pump beam 225 from the beam coupler 240, and shapes and/or focuses the narrowed pump beam 225 into a shaped pump beam 235, which is received by an OPO 250. The output of the OPO 250 includes a signal beam 265, an idler beam 266, and a residual pump beam 255. The pump laser 210 may be, for example, an 808 nm multi-emitter high-power diode bar, emitting on the order of 40 W of light, having a linewidth of approximately 0.3 nm (approximately 100 GHz). In alternative embodiments, the pump laser 210 may produce a beam in the wavelength range of 500 nm to 1200 nm, with an output power range of 10-1000 W. Examples of the pump laser 210 may include single-emitter and multi-emitter diode lasers.

Under the first embodiment, the pump laser 210 may be a quasi-incoherent broadband light source, for example, single emitter or a multiple emitter diode laser, producing a longitudinally multi-mode and a transversally multi-mode beam 215 where $M^2$ is much larger than unity. One example of a quasi-incoherent broadband light source includes, but is not limited to, a laser diode stack. In contrast to a conventional OPO pump source, such as a diode-pumped solid-state laser or fiber laser, the pump laser 210 may include characteristics that are undesirable in the output of the OPO 250, such as broad linewidth and poor beam quality. Thus the pump beam 215 is generally considered to be an "ugly" (poor quality) beam, and previously considered to be unsuitable for driving an OPO.

The pump laser 210 may be frequency-stabilized using the linewidth-narrowing means 220, for example, a volume Bragg grating (VBG), also known as holographic grating. In some lasers, such a linewidth-narrowing means may be integrated in the laser diode itself, for example in distributed feedback laser diodes. For example, high power diode lasers typically suffer from a broad spectrum, which may reduce the efficiency for pumping applications with small absorption or conversion bandwidths. To overcome this problem the spectral properties of the pump source can (optionally) be improved by the linewidth-narrowing means 220. For example, the effect of using a VBG is a well-defined optical feedback within a very small spectral range which stabilizes the spectrum of the pump laser. The linewidth-narrowing means 220 may transmit a portion of the raw pump beam 215 back into the pump laser 210, thereby locking the wavelength of the pump beams 215, 225, producing a narrow band pump light, for example, having a linewidth on the order of, but not limited to, a 30-100 GHz range.

The output beam 225 of the linewidth-narrowing means 220 may be infrared (IR) light or visible spectrum light, routed into an optical beam coupler 240. The beam coupler 240 provides a means of transferring the light 225 from the pump 210, 220 to the OPO 250. The beam coupler 240 may be, for example, an optical fiber, or other suitable wave guide. Optical fiber may be desirable, for example, in scenarios where it is advantageous for the pump source to be somewhat remote from the OPO 250, or where a straight line configuration between the pump 210 and OPO 250 is inconvenient.

A beam shaper/focuser 245 receives the narrowed pump beam 225 from the beam coupler 240. The beam shaper/focuser 245 may be a single lens, or a combination of one or more optical elements configured to condition the light 225 from the pump 210, 220 before entering the cavity of the OPO 250. The conditioned light 235 may be processed by a simple lens system, for example a first lens in order to collimate the beam from the beam coupler 240, and a second lens to focus the beam into the OPO crystal.

The OPO receives the conditioned pump light 235, and selectively channels desirable qualities of the conditioned pump light 235 into a first output beam 265, while channeling undesirable qualities of the conditioned pump light 235 into a second output beam 266. In this way, high quality light 265 may be produced via the OPO 250 from a relatively low quality pump beam 215. Since OPOs are not one hundred percent efficient, some fractional unconverted portion of the received pump light 235 is emitted from the OPO 250 as a residual pump beam 255. The first output beam 265 may be the signal beam in the range of approximately 0.1 to 50 W. The signal beam may have an exemplary wavelength range of 1050-1600 nm for an exemplary pump wavelength around 808 nm. The linewidth of the signal beam may be much narrower than the pump 235, for example, on the order of 1 GHz or below. For example, the signal beam can be, or close to, transversally single-mode and with an $M^2$ value close to unity. In contrast, an exemplary second output beam 266 may be in the range of approximately 0.1 to 50 W, having an exemplary wavelength range of 1800-4000 nm, a linewidth on the order of 100 GHz, where the beam quality $M^2$ is much larger than unity.

As noted previously, in general the term "signal radiation" typically denotes the OPO generated wave with the smaller wavelength, while "idler radiation" typically denotes the larger wavelength. However, either the signal or idler radiation may be resonated in the cavity, with the resonated wave having the desired beam quality and linewidth characteristics.

Figure 3:
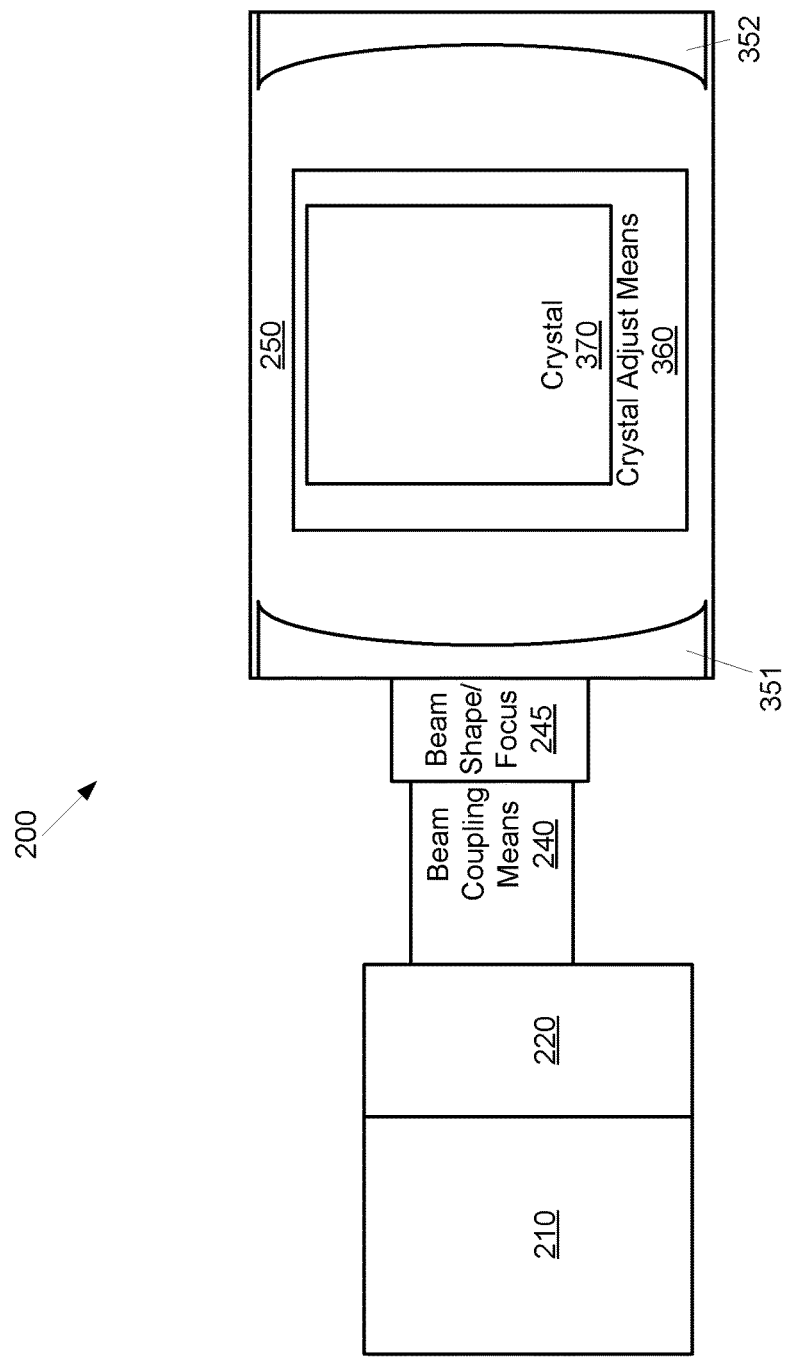
FIG. 3 is a schematic diagram of the first embodiment of FIG. 2 showing more detail of the OPO cavity.

FIG. 3 shows the first embodiment 200 with more detail of the OPO 250. The OPO 250 includes an optical cavity defined by mirrors; in this embodiment a first cavity mirror 351 and a second cavity mirror 352. The cavity mirrors 351, 352 are configured to be highly reflective for the resonant wave/waves, namely, the signal and/or idler.

The received pump light 235 is transmitted through the first cavity mirror 351 and is directed to a non-linear crystal 370 within the cavity. The cavity mirrors 351 may be implemented by directly applying a reflective coating to surfaces of the crystal 370, or by other means familiar to persons having ordinary skill in the art.

For example, the OPO crystal 370 may be Magnesium Doped Lithium Niobate (MgO:LiNbO$_3$), periodically poled and having a multiple grating or a fan-out structure for wavelength tuning, approximately, but not limited to 25 by 12 by 1 mm$^3$. Other crystals may be formed of doped or un-doped LiNbO$_3$ without periodic poling or a single grating, and/or KTP with or without periodic poling, among other materials. Other possible materials may include doped or un-doped LiTaO3 with or without periodic poling, RbTiOAsO$_4$ with or without periodic poling, or BBO. The crystal 370 has a grating having a poling period appropriate to receive a photon from the received pump beam 235 and spontaneously producing a pair of photons inside the cavity. The pair of produced photons respectively have frequencies $\omega_s$ and $\omega_i$. Division of energy between the produced photons is configurable by the optical parametric process of the crystal 370. The frequencies ($\omega_s$, $\omega_i$) may be determined according to characteristics of the crystal 370.

With the nonlinear process, efficiency relies on the intensity of the received pump light 235 (FIG. 2) entering the crystal 370. The received pump light 235 (FIG. 2) must reach an energy threshold to effectively produce the two output wavelengths. For example, focusing 50 W of pump light to diameters of less than 200 μm over a crystal length of 25 mm may be sufficient to overcome the threshold. At this threshold the gain compensates the losses and the oscillation starts. In general, it is desirable to have a high intensity input. However, excessive input intensity may damage the crystal 370.

The produced photons exit the crystal 370, along with some unconverted pump photons, and proceed toward the second cavity mirror 352. Depending on how the second cavity mirror is configured, certain wavelengths will pass through the second cavity mirror 352, exiting the OPO 250 cavity, while other wavelengths will be reflected back within the cavity toward the crystal 370. Therefore, the reflected wavelengths will resonate within the OPO 250 cavity. Usually some macroscopic power level of the resonated wavelength leaks out of at least one cavity-mirror.

In alternative embodiments, the crystal 370 may have a fixed grating, producing fixed output frequencies for a fixed temperature. The crystal 370 output frequencies may be varied by changing the temperature of the crystal 370. Under the first embodiment, the crystal 370 has a single-, fan-out- or multi-period-grating. For example, for a crystal 370 having fan-out gratings, the crystal grating may be moved in relation to the pump beam 235 (FIG. 2) to tune to the desired signal and/or idler wavelengths. Thereby, the output light 265 (FIG. 2) can be tuned by moving the crystal 370 position and/or angle, and/or changing the temperature of the crystal 370. Configuration of the crystal 370 provides for very broad tuning possibilities, because the two generated waves 265, 266 (FIG. 2) ensure both conservation of energy and conservation of momentum. There are an infinite number of signal and idler wave combinations that may be produced by the pump beam 235 (FIG. 2).

The fan-out or multi-period grating non-linear crystal 370 may be mounted on a crystal adjustment means 360, for example, a translation stage, providing a mechanical moving of the crystal 370. The crystal adjustment means 360 may be, for example, piezo-driven, servo-driven, or manually adjustable, among other adjustment means. An exemplary crystal 370 may be formed of Lithium Niobate having a periodic polling, fan-out design.

Returning to FIG. 2, the OPO 250 receives the pump beam 235 and produces the signal and idler beams 255, 256 having new wavelengths, where one of the signal or idler beams 255, 256 may be a substantially single transversal mode wave, having a very narrow linewidth, for example, much narrower than the pump beam 235. Thus the OPO 250 can produce a single mode beam having a very high beam quality, from a relatively low quality pump 210. In essence, the OPO 250 produces two output beams from the input pump beam, the first output beam 265 with the desirable beam qualities, and the second output beam 266 with the undesirable qualities. For example, desirable beam qualities may include being spectrally narrow, such as having a linewidth of approximately one GHz or less, and good beam quality, such as having $M^2$ below three. These qualities may be obtained through resonating the beam in the single-mode OPO cavity. For example, when resonating the signal beam, the nonlinear interaction in the OPO crystal 370 preferably generates additional signal photons with qualities determined by the single-mode cavity. This may lead, for example, to the generation of an output beam 265 with an $M^2$ value close to unity when pumping the OPO 250 with a multi-mode pump beam 235, for example, having dominant contributions of higher Hermite-Gaussian modes, for example $TEM_{11}$, $TEM_{21}$, $TEM_{22}$, among others.

Depending upon the application, the first beam 265 may be the signal and the second beam 266 may be the idler, or the first beam 265 may be the idler, and the second beam 266 may be the signal. The high quality beam 265 output by the OPO 250 is suitable for a wide range of uses, for example, bio-imaging applications requiring well defined wavelength, and good beam quality for coupling into an optical fiber.

Previously, coherent narrow linewidth pump lasers for OPOs were relatively expensive, for example, a fiber amplified single mode laser, or diode-pumped fiber lasers. In addition, fiber lasers are typically restricted to output wavelengths above 1000 nm. Under the first embodiment much lower pump wavelengths (808 nm, down to approximately 450 nm) may be used, which may be more efficient for OPO pumping, as longer wavelengths require more power to efficiently convert light in the OPO 250.

Compared to the more commonly used fiber laser sources, using quasi-incoherent broadband pump sources, for example, diode lasers, allows use of a pump at smaller wavelengths such as 808 nm and at the same time cutting costs of the pump source 210, for example by fifty percent or more. In contrast to common fiber lasers, the pump source 210 may deliver the light to the OPO 250 cavity through a multi-mode fiber, i.e. with a different spatial profile and beam quality. Even so, the emitted light 265 from the OPO 250 may be spatially substantially single-mode due to the OPO 250 cavity design.

Typically, quasi-incoherent broadband pump sources have been used to pump solid state lasers. However, light generation in a laser is quite different from light generation in an OPO, as the fundamental mechanism is different. OPOs generally use a direct conversion of light. In contrast, a laser is restricted to transitions of the laser medium, which will typically limit the accessible tuning range, where an OPO can be tuned over a very broad range.

Figure 4:
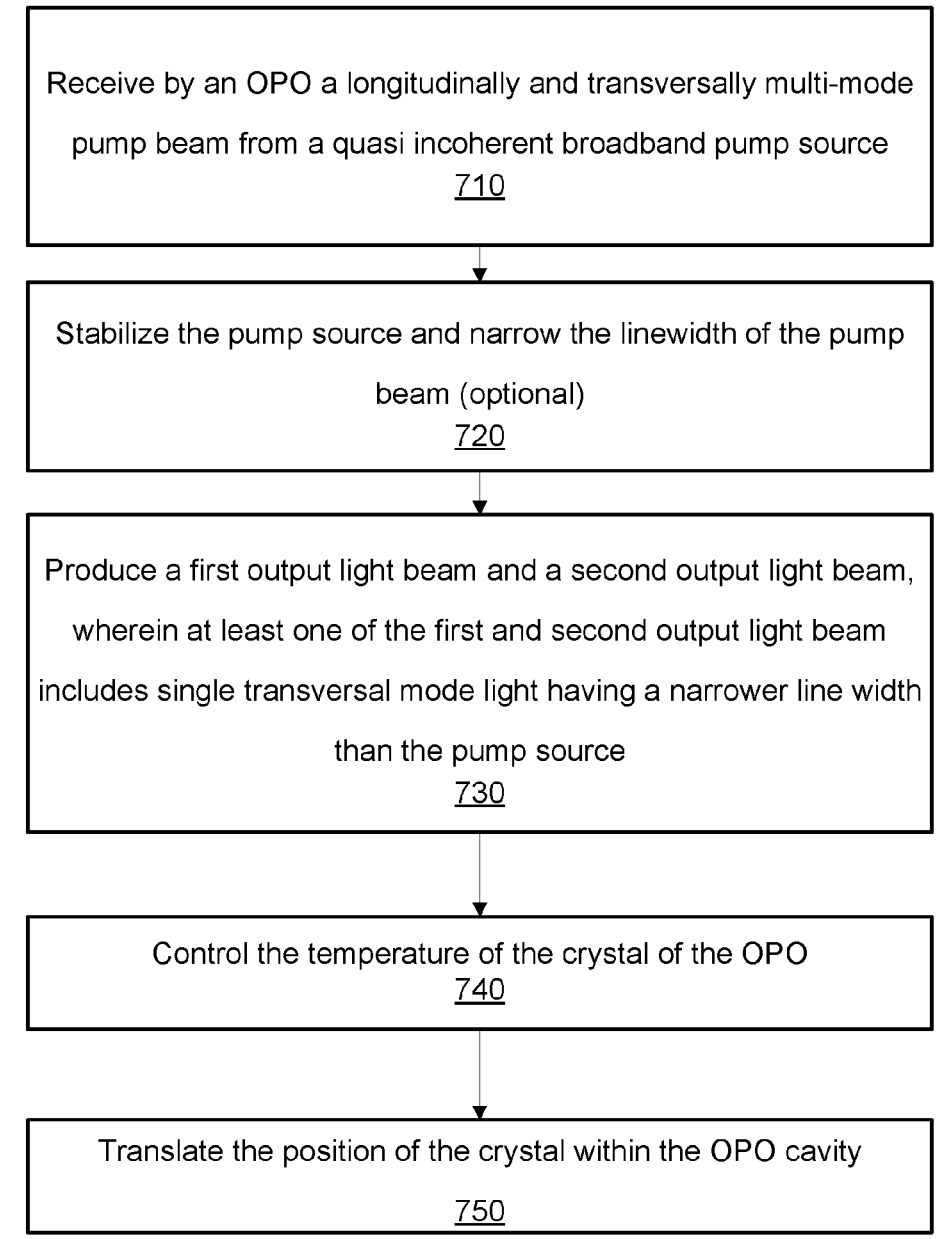
FIG. 4 is a flowchart of an exemplary method for pumping an OPO with a quasi-incoherent broadband source.

FIG. 4 is a flowchart of an exemplary method 700 for pumping an OPO 250 with a quasi-incoherent broadband pump source 210. It should be noted that any process descriptions or blocks in flowcharts should be understood as representing modules, segments, portions of code, or steps that include one or more instructions for implementing specific logical functions in the process, and alternative implementations are included within the scope of the present invention in which functions may be executed out of order from that shown or discussed, including substantially concurrently or in reverse order, depending on the functionality involved, as would be understood by those reasonably skilled in the art of the present invention.

An OPO 250 having a crystal 370 receives a quasi-incoherent broadband pump beam 215, 225, 235 from a quasi-incoherent broadband pump source 210, as shown by block 710. The pump source 210 may be stabilized and the linewidth of the pump beam may be narrowed, as shown in block 720. For example, the pump source 210 may be coupled with a linewidth narrowing means 220 such as a volume Bragg grating, as described above. In some embodiments, the linewidth stabilization may be omitted. The OPO 250 produces a first output light beam 265 and a second output light beam 266 from the pump beam 215, 225, 235, wherein at least one of the first output light beam 265 and second output light beam 266 consists of substantially single transversal mode light having a narrower linewidth than the pump source 210, as shown by block 730.

The temperature of the crystal 370 may be controlled, as shown by block 740, for example, to tune the wavelength of the first output light beam 265 and/or the second output light beam 266. The temperature of the crystal 370 may be controlled, for example, by coupling the crystal 370 to a Peltier element or resistive heater (not shown) and an attached PID controller (not shown). The position of the crystal 370 may be translated within the cavity of the OPO 250 as shown by block 750, for example, using a piezo controller or a servo controller.

While the above description uses the relative term "linewidth narrowing" at various stages of the embodiments, it should be noted the light actually entering the OPO cavity is still considered "broadband" following the above definition (>10 GHz). For example, the optional "linewidth narrowing means" may only reduce the linewidth of the raw pump source to typical values on the order of 30-100 GHz. The very narrow output (<1 GHz) is then generated via the OPO process itself.

In summary, it will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light source, comprising:
   a quasi-incoherent broadband pump source configured to produce a longitudinally and transversally multi-mode pump beam;
   an Optical Parametric Oscillator (OPO) comprising an optical cavity containing a crystal configured to receive light from the pump source and produce a first output light beam and a second output light beam; and
   an optical coupler between the pump source and the OPO, wherein at least one of the first and second output light beam comprises substantially single transversal mode light having a narrower linewidth than the pump source.

2. The light source of claim 1, further comprising means for narrowing a linewidth of the broadband pump beam disposed between the pump source and the optical coupler.

3. The light source of claim 1, further comprising means for narrowing a linewidth of the broadband pump beam integrated within the quasi-incoherent broadband pump source.

4. The light source of claim 2, wherein the means for narrowing the linewidth of the broadband pump source comprises a volume Bragg grating.

5. The light source of claim 1, wherein the optical coupler comprises an optical fiber.

6. The light source of claim 1, wherein the quasi-incoherent broadband pump source comprises a single emitter diode pump or a multi-emitter diode pump.

7. The light source of claim 1, wherein the wavelength of the broadband pump beam is in the range of 500 nm to 1200 nm.

8. The light source of claim 1, wherein at least one of the first and second output light beam comprises a linewidth on the order of 1 GHz or less.

9. The light source of claim 8, wherein at least one of the first and second output light beam has an $M^2$ of three or below.

10. The light source of claim 1, further comprising means for tuning the first output light beam and the second output light beam from the OPO.

11. The light source of claim 10, wherein the tuning means further comprises at least one of the group consisting of means to control the temperature of the crystal, means to translate the position of the crystal, and means to rotate the crystal within the cavity.

12. The light source of claim 10, wherein the crystal is selected from the group consisting of a crystal that is cut for birefringent phase matching, a multi period grating crystal, a fan-out grating crystal, and a single grating crystal.

13. A method for producing an output beam from an Optical Parametric Oscillator (OPO) comprising an optical cavity containing a crystal, comprising the steps of:
receiving by the OPO a longitudinally and transversally multi-mode pump beam from a quasi-incoherent broadband pump source; and
producing from the pump beam, by the OPO, a first output light beam and a second output light beam, wherein at least one of the first and second output light beam comprises single transversal mode light having a narrower linewidth than the pump source.

14. The method of claim 13, further comprising the step of stabilizing the pump source and narrowing the linewidth of the pump beam.

15. The method of claim 13, wherein the $M^2$ of the pump beam is much larger than unity.

16. The method of claim 15, wherein at least one of the first and second output light beam has an $M^2$ on the order of unity.

17. The method of claim 13, further comprising the step of controlling the temperature of the crystal.

18. The method of claim 13, further comprising the step of translating the position of the crystal within the cavity.

19. The method of claim 13, further comprising the step of rotating the crystal within the cavity.

20. A light source receiving a quasi-incoherent broadband pump beam produced by a pump source coupled with means for narrowing and stabilizing the linewidth of the pump beam, the pump beam transmitted from the pump source via an optical coupler, the light source comprising:
an Optical Parametric Oscillator (OPO) comprising an optical cavity containing a crystal configured to receive light from the narrowing means and produce a first output light beam and a second output light beam,
wherein at least one of the first and second output light beam comprises substantially single transversal mode light having a narrower linewidth than the pump source.

* * * * *